United States Patent
Becker et al.

(10) Patent No.: US 6,597,613 B1
(45) Date of Patent: Jul. 22, 2003

(54) LOAD INDEPENDENT SINGLE ENDED SENSE AMPLIFIER

(75) Inventors: Scott T. Becker, Darien, IL (US); Betina Hold, Los Altos, CA (US); Sudhir S. Moharir, Santa Clara, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 0 days.

(21) Appl. No.: 10/113,759

(22) Filed: Mar. 27, 2002

(51) Int. Cl.$^7$ .................................. G11C 7/06
(52) U.S. Cl. ..................... 365/207; 327/53; 327/66
(58) Field of Search .................... 365/207, 205; 327/53, 66

(56) References Cited

U.S. PATENT DOCUMENTS 4,644,197 A * 2/1987 Flannagan .................. 327/53
4,697,112 A * 9/1987 Ohtani et al. ............... 327/53
5,715,204 A * 2/1998 Barcella ..................... 365/207
6,265,906 B1 * 7/2001 Komatsu .................... 327/53

* cited by examiner

Primary Examiner—Tan T. Nguyen
(74) Attorney, Agent, or Firm—Martine & Penilla, LLP

(57) ABSTRACT

A load independent single ended sense amplifier is provided. The sense amplifier includes a first current mirror having a first load transistor and a first reflected current transistor, and a second current mirror having a second load transistor and a second reflected current transistor. The first load transistor is capable of communicating a load current to the second load transistor. In addition, a reflected current flowing through the first reflected current transistor and the second reflected current transistor generates an amplified load current.

22 Claims, 8 Drawing Sheets

LOAD INDEPENDENT SINGLE ENDED SENSE AMPLIFIER

BACKGROUND OF THE INVENTION

1. Field of the Invention

This invention relates generally to integrated circuits, and more particularly, to apparatuses and methods for load independent single ended sense amplifiers in programmable read only memory.

2. Description of the Related Art

Semiconductor memory devices are widely used in the manufacture of digital equipment, such as microprocessor systems. To store fixed, commonly used programs, microprocessor systems generally use Read Only Memory devices or "ROMs," such as the basic input/output system (BIOS) ROM for computer systems.

Semiconductor ROMs are typically configured as an array memory cells, wherein each individual memory cell is coupled to both a wordline and a bitline. To select a particular memory cell during a read operation, memory accessing circuitry is commonly utilized. For example, memory access circuit components typically include addressing circuitry for selecting a memory cell, wordline drivers for driving a selected wordline, sense amplifiers for amplifying the signals read from the selected memory cell, and output buffers for driving data out of the memory.

FIG. 1A shows a conventional ROM addressing block diagram used for accessing digital data stored within a ROM core 100. Typically, host computers access the ROM core 100 through an address input bus 110 that may be coupled to an X-DECODER 102 and a Y-DECODER 104. In general, X-DECODER 102 is used for addressing a selected row within ROM core 100, and Y-DECODER 102 is used for addressing a selected column within ROM core 100. Often, the X and Y decoders are implemented for reducing memory array aspect ratios by folding (i.e., dividing) long addressable memory columns into several shorter memory columns. Once folded into several columns, the X and Y decoders are capable of accessing the addressed data by appropriately performing a suitable multiplexing function.

Once a row and column is selected from ROM core 100, a very low voltage, which may be as low as 20 milli-volts (mV), can be sensed on a data bus 112 representing the addressed data. To appropriately read the addressed data, suitable amplification is performed using a sense amplifier 106. Once the sensed data signal is amplified to about 3.3 volts or about 5 volts in sense amplifier 106, the voltage amplified data (i.e., digital data) is passed through as an amplified data output 114 to an output buffer 108. At output buffer 108, the voltage amplified data is current amplified to provide an appropriate level of current drive once the read data is passed to a ROM output bus 116.

FIG. 1B illustrates a conventional single ended differential pair sense amplifier 106. As shown, sense amplifier 106 includes a rail voltage (Vcc) which is typically about 3.3 volts or 5 volts connected to a transistor 122 and a transistor 120 that form a current mirror. Connected to the current mirror transistors is a gain transistor 126 and a gain transistor 124. A gate of gain transistor 124 is coupled to a $V_{REF}$, which is typically about Vcc/2. Further, a gate of gain transistor 126 is shown interfacing with ROM core 100 via data bus 112. Coupled between transistor 122 and gain transistor 126 is amplified data output 114 that feeds to output buffer 108 where appropriate current amplification is performed.

Generally, the conventional single ended differential pair ROM architecture works well for applications in which low power consumption is not of any particular concern. However, in applications where low power consumption is needed, the high power consuming response of sense amplifier 106 may not be acceptable. Accordingly, sense amplifier 106 is not well suited for use in portable electronic devices that critically depend on a batteries limited useful life. As an example, many modern hand-held portable electronics devices such as laptop computers, pen-based computers and cellular phones, are many times rendered useless when memory accessing operations drain the electronic device's battery.

In addition, the conventional single ended differential pair ROM architecture requires considerable logic, both internal and supporting, to function properly. As a result, the conventional single ended differential pair ROM architecture requires a large area of the ROM. In view of the foregoing, there is a need for a sense amplifier that is low power consuming and has a reduced area for use in memory accessing operations. To this end, the sense amplifiers should provide high speed sensing, which is low power, load independent, and requires a reduced area for implementation.

SUMMARY OF THE INVENTION

Broadly speaking, the present invention fills these needs by providing a load independent single ended sense amplifier. In one embodiment, a sense amplifier for amplifying bitline current is disclosed. The sense amplifier includes a first current mirror having a first load transistor and a first reflected current transistor, and a second current mirror having a second load transistor and a second reflected current transistor. The first load transistor is capable of communicating a load current to the second load transistor. In addition, a reflected current flowing through the first reflected current transistor and the second reflected current transistor generates an amplified load current. In one aspect, a drop in the load current across the first load transistor can be configured to increase the current in the first reflected current transistor. In addition, the drop in the load current across the first load transistor can be configured to reduce the current in the second load transistor thereby reducing the current in the second reflected current transistor.

In another embodiment, a ROM is disclosed that includes a sense amplifier for amplifying bitline current. The ROM includes a memory cell array having a depth that is defined by a plurality of wordlines and a width that is defined by a plurality of bitlines. In addition, a first current mirror including a first load transistor and a first reflected current transistor is included, where the first load transistor is in electrical communication with a bitline. A second current mirror is also included that has a second load transistor and a second reflected current transistor. The first load transistor is capable of communicating a load current to the second load transistor, and a reflected current flowing through the first reflected current transistor and the second reflected current transistor generates an amplified load current.

A further sense amplifier for amplifying bitline current is disclosed in a further embodiment of the present invention. The sense amplifier includes an isolation transistor that is in electrical communication with a bitline. Similar to above, a first current mirror is included that has a first load transistor and a first reflected current transistor. Both the first load transistor and the first reflected current transistor are p-type transistors. Also, the first load transistor is capable of receiving a load current from the isolation transistor. A second current mirror is also included that has a second load transistor and a second reflected current transistor. The second load transistor and the second reflected current transistor are n-type transistors. The first load transistor is capable of communicating the load current to the second load transistor. Further, a reflected current flowing through the first reflected current transistor and the second reflected current transistor generates an amplified load current. In one aspect, the gate and drain of the first load transistor can be coupled together. Also, the gate and drain of the second load transistor can be coupled together. In a further aspect, reflected current flow through the first reflected current transistor is increased and the reflected current flow through the second reflected current transistor is reduced when a "0" core cell on the bitline is addressed.

Advantageously, the embodiments of the present invention are highly tunable from both a current and voltage point of view, making the embodiments of the present invention ideal for various technologies. Further, the dual current mirror configuration of the embodiments of the present invention provides high speed sensing using both voltage and current amplifying stages. Moreover, the isolation transistor of the embodiments of the present invention advantageously allows the sense amplifier to be mux independent. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a load independent single ended sense amplifier. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1A:
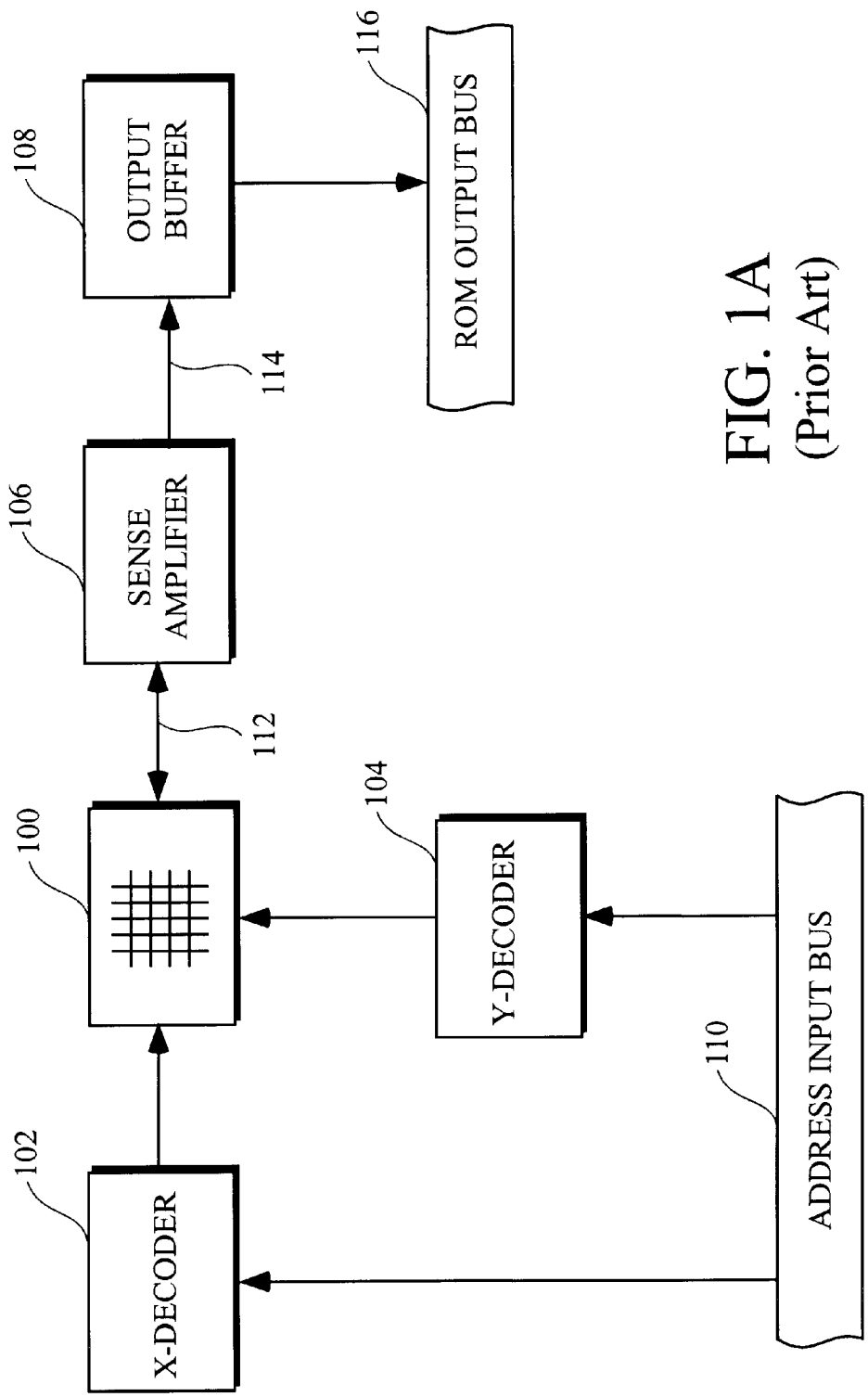
FIG. 1A shows a conventional ROM addressing block diagram used for accessing digital data stored within a ROM core.
Figure 1B:
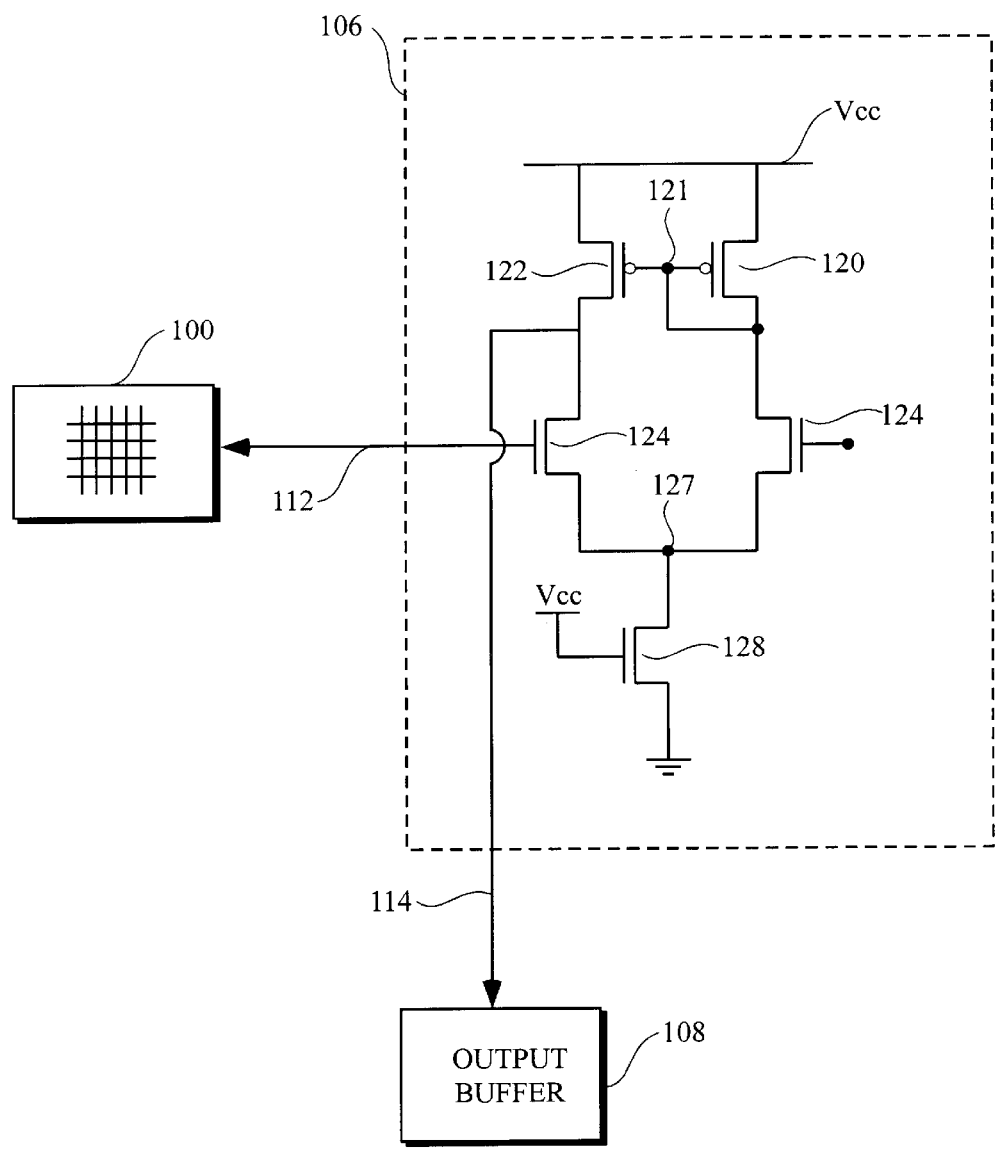
FIG. 1B illustrates a conventional single ended differential pair sense amplifier.
Figure 2:
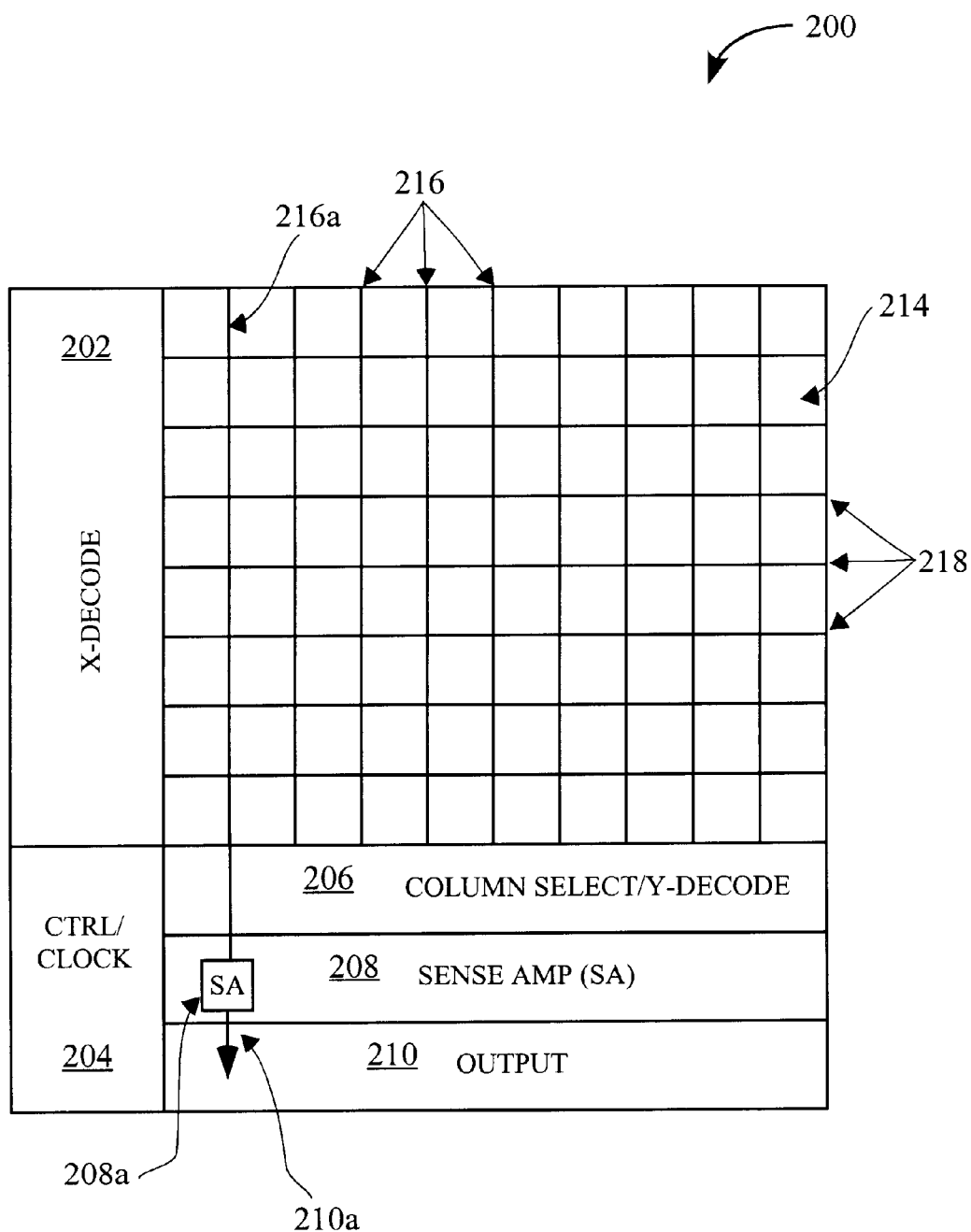
FIG. 2 is a block diagram showing a ROM having a load independent single ended sense amplifier, in accordance with an embodiment of the present invention.

Embodiments of the present invention provide a current mode sense amplifier that is insensitive to loads on the bitline. FIG. 2 is a block diagram showing a ROM 200 having a load independent single ended sense amplifier, in accordance with an embodiment of the present invention. The ROM 200 includes an X-decoder 202 and a Y-decoder 206 for addressing a ROM core 214. The ROM core 214 comprises a plurality of bitlines 216 addressed by wordlines 218, which form memory cells at the intersections of the wordlines 218 and the bitlines 216. The X and Y decoders 202 and 206 can be implemented for reducing memory array aspect ratios by folding (i.e., dividing) long addressable memory columns into several shorter memory columns. Once folded into several columns, the X and Y decoders 202 and 206 are capable of accessing the addressed data by appropriately performing a suitable multiplexing function.

The ROM 200 further includes a plurality of sense amplifiers 208 coupled to output circuits 210. The sense amplifiers 208 are utilized to sense changes in current occurring on the bitlines 216. For example, when a memory cell along bitline 216a is addressed, sense amplifier 208a can sense any change in current occurring along bitline 216a. As explained in greater detail subsequently, once a row and column is selected from the ROM core 214, a very low current can be sensed on the bitline 216a representing the addressed data. To appropriately read the addressed data, suitable amplification is performed using the sense amplifier 208a. Once the sensed data signal is amplified, often to about twice the actual current change along the bitline 216a, the current amplified data (i.e., digital data) is passed through as an amplified data output 210a. At output buffer 210, the amplified data is current amplified to provide an appropriate level of current drive once the read data is passed to a ROM output bus.

Figure 3:
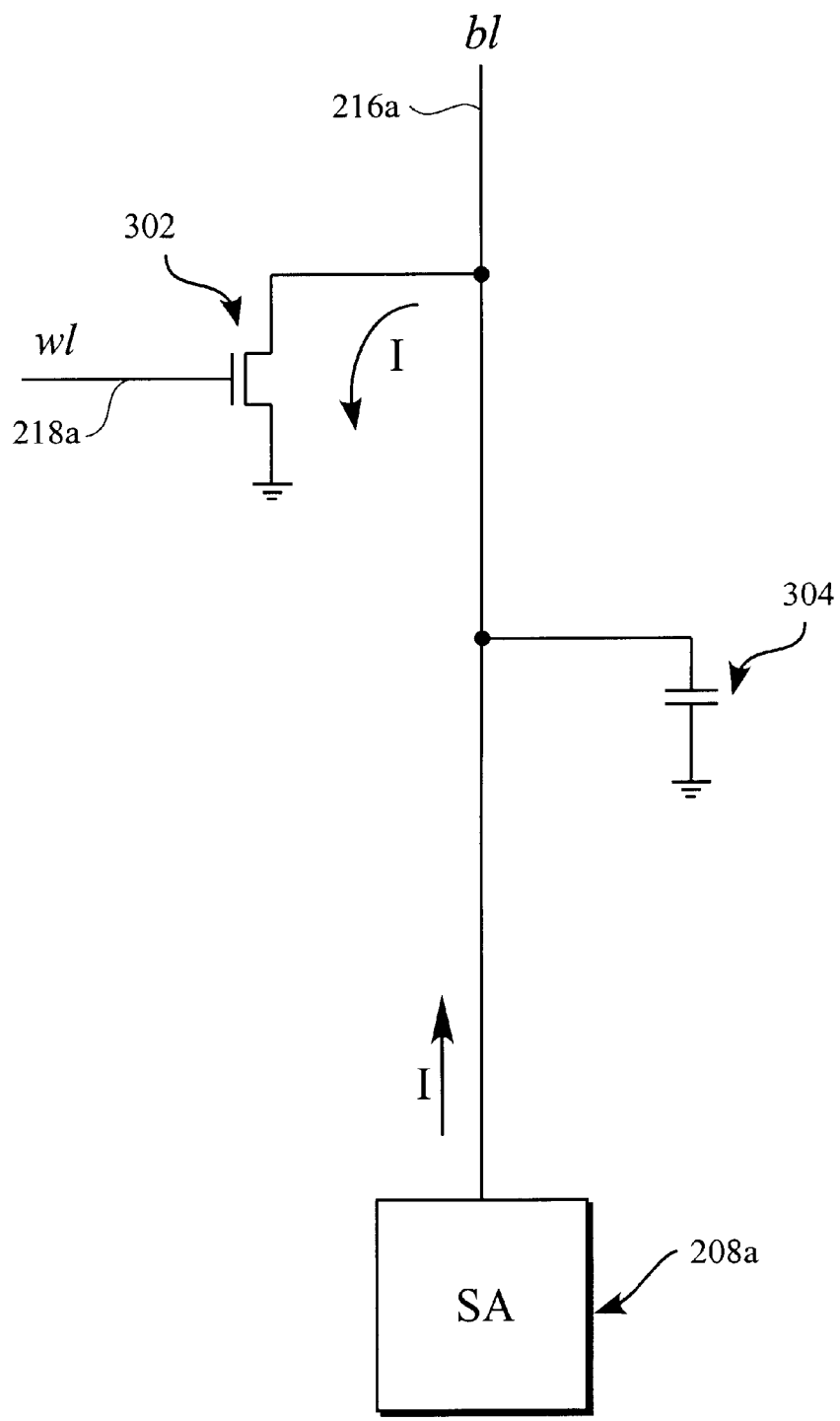
FIG. 3 is a schematic diagram showing an exemplary bitline and sense amplifier, in accordance with an embodiment of the present invention.

As mentioned above, a sense amplifier of the embodiments of the present invention can sense changes in current occurring on the bitlines. FIG. 3 is a schematic diagram showing an exemplary bitline 216a and sense amplifier 208a, in accordance with an embodiment of the present invention. FIG. 3 illustrates the current sensing ability of a sense amplifier 208a of the embodiments of the present invention. More particularly, FIG. 3 shows an exemplary bitline 216a coupled to a wordline 218a via transistor 302.

Transistor 302 forms a "0" core memory cell along the bitline 216a because transistor 302 pulls the bitline 216a to "0" when wordline 218a is asserted. Specifically, the core memory cell comprising transistor 302 is addressed via wordline 218a. Prior to addressing the core memory cell, the bitline 216a is precharged to a "1" state. The wordline 218a is then asserted, thus setting the gate of transistor 302 high. As a result, transistor 302 turns ON and allows current to flow from the bitline 216a to ground. To create a "1" cell, the transistor 302 is disabled thus allowing the bitline 216a to remain high when the wordline 218a is asserted.

Embodiments of the present invention sense changes in current through the bitline 216a. In particular, embodiments of the present invention allow current to flow through the bitline 216a while keeping the voltage on the bitline 216a close to a constant high value, although one embodiment allows the bitline 216a voltage to drop slightly. As shown in FIG. 3, the bitline 216a has a bitline capacitance 304 associated with it. Current through the bitline capacitance can be characterized by the following formula:

$$I = C\frac{dV}{dt}$$

where I is the current, C is the bitline capacitance, and $$\frac{dV}{dt}$$

is the change in voltage on the bitline over time. As can be seen, when the voltage on the bitline is kept relatively constant, the bitline capacitance 304 will not provide the current drawn by the core cell transistor 302. As a result, the core cell transistor 302 draws current from the sense amplifier 208a, thus allowing the sense amplifier 208a to sense the current change caused by the core cell transistor 302.

Hence, embodiments of the present invention keep the voltage on the bitline relatively constant. That is, $$\frac{dV}{dt}$$

is kept low, for example, 0.001 volts. Thus, the bitline capacitance 304 will have a low affect on I. For example, if the $$\frac{dV}{dt}$$

is 0.001 volts, the bitline capacitance 304 will have 0.001C affect on I. In this manner, the embodiments of the present invention are insensitive to the load on the bitline.

Figure 4:
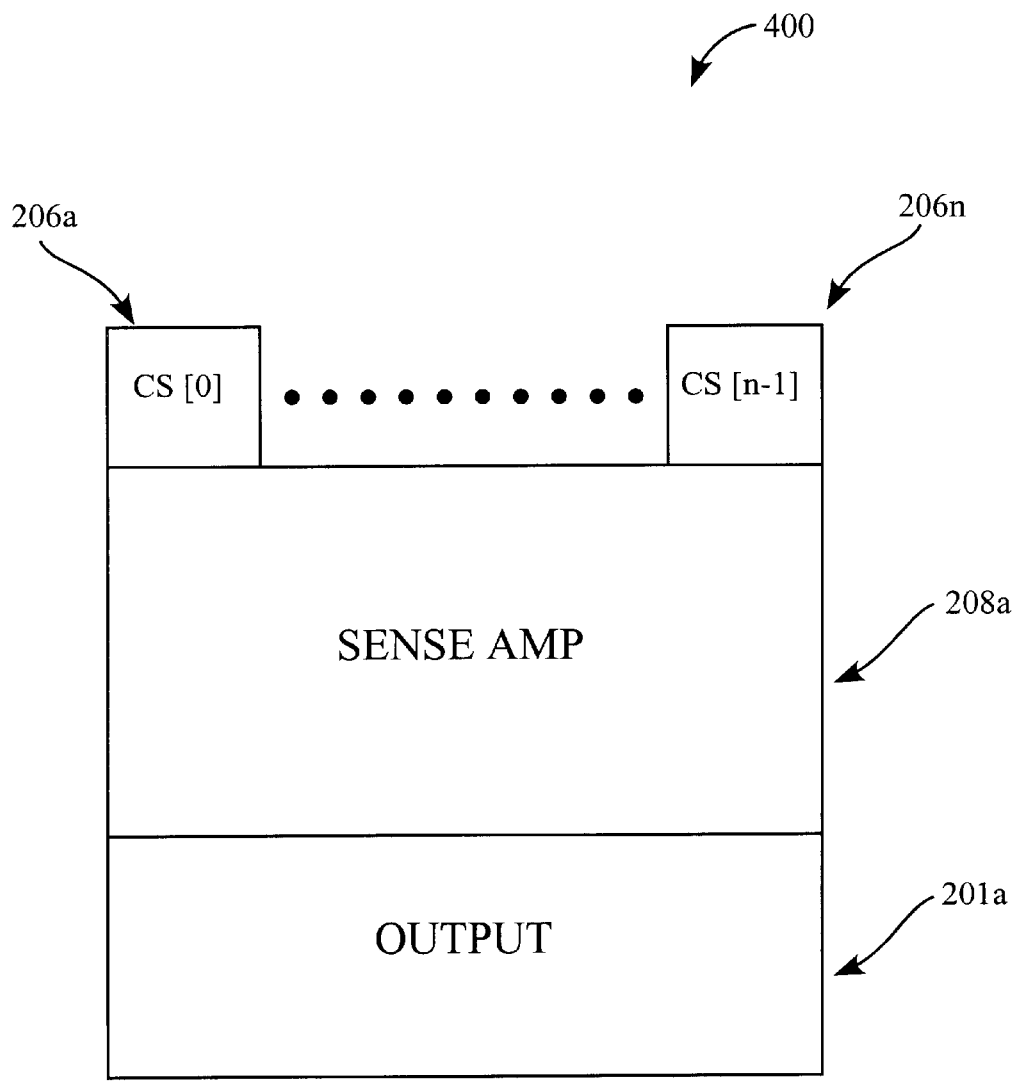
FIG. 4 is a block diagram showing a sense amplifier configuration, in accordance with an embodiment of the present invention.

FIG. 4 is a block diagram showing a sense amplifier configuration 400, in accordance with an embodiment of the present invention. The sense amplifier configuration 400 illustrates the configuration of a sense amplifier and associated circuitry for processing a single bit in the ROM. As mentioned above, the X and Y decoders of the ROM can be implemented for reducing memory array aspect ratios by folding (i.e., dividing) long addressable memory columns into several shorter memory columns. Hence, the sense amplifier configuration 400 includes a plurality of column select circuits 206a–206n. Each short memory column comprising a folded bitline is associated with a column select unit 206a–206n. In this manner, the X and Y decoders are capable of accessing the addressed data by appropriately performing a suitable multiplexing function using the column select units 206a–206n. The sense amplifier configuration 400 further includes a sense amplifier 208a coupled to an output 210a. The sense amplifier 208a is utilized to sense changes in current occurring on the selected short memory column comprising the folded bitline via the appropriate column select unit 206a–206n.

Figure 5:
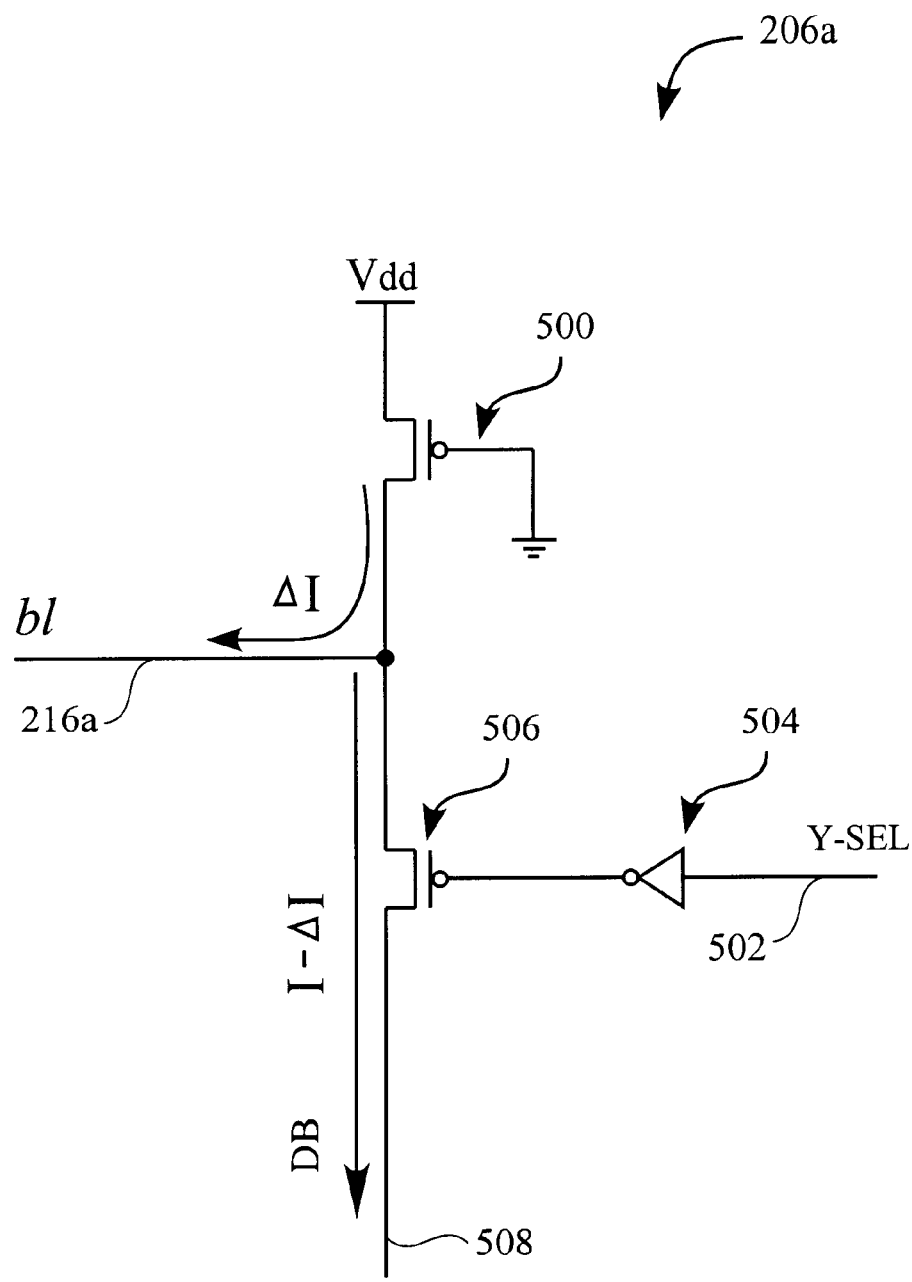
FIG. 5 is a schematic diagram showing an exemplary column select unit, in accordance with an embodiment of the present invention.

FIG. 5 is a schematic diagram showing an exemplary column select unit 206a, in accordance with an embodiment of the present invention. The exemplary column select unit 206a includes bitline load transistor 500 coupled to a column select transistor 506, which is coupled to a column select inverter 504. As mentioned previously, embodiments of the present invention keep the voltage on the bitline 216a relatively constant to allow core cells storing a "0" to draw current from the sense amplifier rather than the bitline capacitance. To this end, embodiments of the present invention utilize a bitline load transistor 500 to provide a relatively constant voltage to the bitline 216a. As shown in the exemplary column select unit 206a, the gate of the p-channel bitline load transistor 500 is coupled to ground. In addition, one terminal of the bitline load transistor 500 is coupled to $V_{dd}$, and the other terminal is coupled to the bitline 216a.

The bitline load transistor 500 also provides a load current to both the sense amplifier and the core cell via the bitline 216a. In particular, when a "0" core cell is addressed, load current is pulled along the bitline 216a to the core cell. The bitline load transistor 500 provides this current. For example, when a "0" core cell is addressed along bitline 216a, an amount of load current ΔI is pulled through the bitline load transistor 500 to the core cell via the bitline 216a.

The column select transistor 506 allows current to flow from the bitline load transistor 500 to the sense amplifier when the particular column select unit 206a is selected. Specifically, a y-select line 502 is asserted when a core cell is addressed that is located along the short memory column associated with the column select unit 206a. In response, the inverter 504 inverts the signal along the y-select line 502 and turns on the column select transistor 506. As a result, the column select transistor 506 allows the load current to flow from the bitline load transistor 500 to the sense amplifier. When the addressed core cell is a "0" core cell, a portion of the load current ΔI is pulled though the bitline load transistor 500 to the core cell via the bitline 216a. Hence, the load current flowing to the sense amplifier through the data bus (DB) 508 when a "0" core cell is addressed is about I–ΔI, where I is the current through the bitline load transistor 500 and ΔI is the current provided to the "0" core cell.

Figure 6:
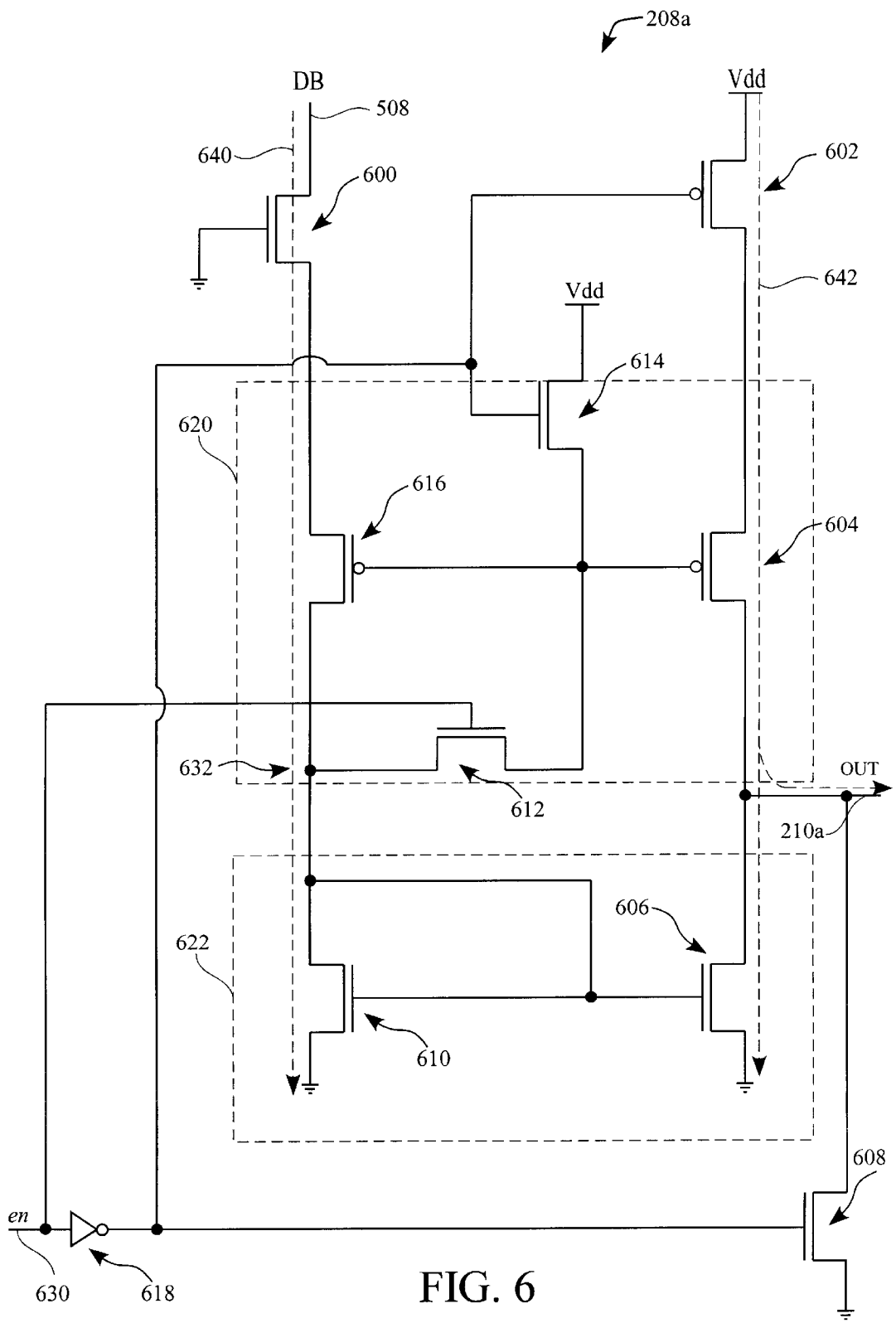
FIG. 6 is a schematic diagram showing an exemplary sense amplifier, in accordance with an embodiment of the present invention.

FIG. 6 is a schematic diagram showing an exemplary sense amplifier 208a, in accordance with an embodiment of the present invention. The sense amplifier 208a includes an isolation transistor 600 configured to isolate the mux load from the sense amplifier 208a. As mentioned previously, embodiments of the present invention can reduce memory array aspect ratios by folding (i.e., dividing) long addressable memory columns into several shorter memory columns. Hence, embodiments of the present invention can include a plurality of column select circuits, such as columns select circuit 206a illustrated in FIG. 5. The isolation transistor 600 is configured to allow a variable number of column select circuits to be included in the sense amplifier configuration, with the data bus 508 of each column select circuit providing load current to the isolation transistor 600. Hence, the isolation transistor 600 of the embodiments of the present invention advantageously allows the sense amplifier to be mux independent.

Coupled to the isolation transistor 600 is a first current mirror 620, which is further coupled to a second current mirror 622. The first current mirror 620 includes a first load transistor 616 and a first reflected current transistor 604 having their gates coupled together, both transistors being p-type transistors. Further, the drain and gate of the first load transistor 616 are coupled together via a first power down transistor 612. In addition, the gates of the first load transistor 616 and the first reflected current transistor 604 are coupled to a second power down transistor 614. The first reflected current transistor 604 also is coupled to an amplified data output 210a and an output reflected current transistor 602, which is a p-type transistor that provides a reflected current 642 to the first current mirror 620.

The second current mirror 622 includes a second load transistor 610 and a second reflected current transistor 606 having their gates coupled together, both transistors being n-type transistors. The source of the second load transistor 610 is coupled to ground and the drain and gate of the second load transistor 610 are coupled together. The second reflected current transistor 606 is coupled to the amplified data output 210a and to ground. The second load transistor 610 receives the load current 640 from the first current mirror 620 and the second reflected current transistor 606 receives the reflected current 642 from the first current mirror 620.

The sense amplifier 208a further includes an enable line 630 that provides an enable single, which can be used to control power flow through the sense amplifier 208a. In particular, the enable single is provided to a buffer 618, which provides an inverted enable signal to the output reflected current transistor 602, the second power down transistor 614, and a third power down transistor 608. When the enable line 630 is "0," a "1" is provided to the gate of the output reflected current transistor 602, which turns OFF and thus does not provide reflected current 642 to the sense amplifier 208a. A "1" is further provided to the gate of the second power down transistor 614, which turns ON and thus provides a "1" to the gates of the first load transistor 616 and the first reflected current transistor 604. As a result, both the first load transistor 616 and the first reflected current transistor 604 turn OFF and thus prevent the load current 640 from reaching ground. A "1" is also provided to the gate of the third power down transistor 608, which turns ON thus pulling the amplified data output 210a to ground. In addition, when the enable line 630 is "0," a "0" is provided to the gate of the first power down transistor 612, which turns OFF thus terminating current flow between the gate and source of the first load transistor 616. In this manner, the enable line 630 can turn the sense amplifier 208a OFF and prevent power from flowing through the sense amplifier 208a.

When the enable line 630 is "1," a "0" is provided to the gate of the output reflected current transistor 602, which turns ON and thus provides reflected current 642 to the sense amplifier 208a. A "0" is further provided to the gate of the second power down transistor 614, which turns OFF and thus allows the gates of the first load transistor 616 and the first reflected current transistor 604 to attain their steady state voltage. As a result, both the first load transistor 616 and the first reflected current transistor 604 turn ON and thus allow the load current 640 to flow through the sense amplifier 208a. A "0" is also provided to the gate of the third power down transistor 608, which turns OFF thus preventing the amplified data output 210a from reaching ground through the third power down transistor 608. In addition, when the enable line 630 is "1," a "1" is provided to the gate of the first power down transistor 612, which turns ON thus allowing current flow between the gate and source of the first load transistor 616 effectively shorting the gate to the drain. In this manner, the enable line 630 can turn the sense amplifier 208a ON, allowing power to flow through the sense amplifier 208a.

In operation, the sense amplifier 208a is turned ON via the enable line 630 as described above. As a result, load current 640 is allowed to flow from the column select unit to the isolation transistor 600 via the data bus 508. Initially, the load current 640 flows through the isolation transistor 600 to the first load transistor 616, from the first load transistor 616 to the second load transistor 610 to ground.

As mentioned above, the bitline load transistor 500 of FIG. 5 provides a load current 640 to both the sense amplifier and the core cell via the bitline. In particular, when a "0" core cell is addressed, current is pulled along the bitline to the core cell. For example, when a "0" core cell is addressed along bitline, an amount of current ΔI is pulled though the bitline load transistor 500 to the core cell via the bitline. Hence, the load current 640 flowing to the sense amplifier 208a through the data bus (DB) 508 is about I−ΔI, where I is the load current through the bitline load transistor 500 and ΔI is the portion of the load current provided to the "0" core cell. In addition, because of the ΔI, the bitline can drop slightly in voltage, for example, the bitline voltage can drop about 100–200 mV.

The bitline voltage drop and the ΔI drop in the load current 640, together with the voltage drop across the first load transistor 616, cause a voltage drop at node 632. As a result, a voltage drop occurs at the gates of the first load transistor 616 and the first reflected current transistor 604. The voltage drop that occurs at the gate of the first reflected current transistor 604 increases the flow of the reflected current 642 across the reflected current transistor 604.

In addition, the voltage drop at node 632 is transferred to the gates of the second load transistor 610 and the second reflected current transistor 606. The voltage drop at the gate of the second reflected current transistor 606 reduces the amount of reflected current 642 flowing across the second reflected current transistor 606. As a result, the amount of reflected current 642 is increased at the amplified data output 210a.

Thus, both the first reflected current transistor 604 and the second reflected current transistor 606 increase the reflected current 642 on the amplified data output 210a when a "0" core cell is addressed. That is, when a "0" core cell is addressed, the first reflected current transistor 604, which is a p-type transistor, allows additional reflected current 642 to flow across its terminals in response to the voltage drop occurring at the gate of the first reflected current transistor 604. In addition, the second reflected current transistor 606, which is an n-type transistor, decreases the flow of reflected current 642 across its terminals in response to the voltage drop occurring at the gate of the second reflected current transistor 606. Since additional reflected current 642 is flowing to the amplified data output 210a from the first reflected current transistor 604, and less reflected current 642 is flowing from the amplified data output 210a to ground because of the second reflected current transistor 604, the reflected current 642 at the amplified data output 210a is amplified resulting in a high transition at the output 210a.

Thus, when the widths of the transistors of the first and second current mirrors are about equal, a decrease in the load current 640 of ΔI across the first load transistor 616 causes an increase in the reflected current 642 of ΔI across the first reflected current transistor 604. That is, the voltage drop occurring at node 632 is applied to the gate of the first reflected current transistor 604, causing the first reflected current transistor 604 to supply additional reflected current 642 to the amplified data output 210a.

In addition, the same decrease in the load current 640 of ΔI is applied to the gates of the second load transistor 610 and the second reflected current transistor 606, which causes the second reflected current transistor 606 to allow ΔI less reflected current 642 to flow to ground. Since the first reflected current transistor 604 is supplying an additional ΔI reflected current 642 to the amplified data output 210a, and second reflected current transistor 606 is pulling ΔI less reflected current 642 from the amplified data output 210a, the current at the amplified data output 210a is increased by about 2ΔI.

Furthermore, as mentioned above, embodiments of the present invention can allow the bitline to drop slightly in voltage, for example, 100–200 mV. This voltage drop increases the voltage drop occurring at node 632, and as a result, further increases the amplification at the amplified data output 210*a* and allows faster switching. In addition, the transistor size in the embodiments of the present invention can vary to adjust the amount of amplification occurring at the amplified data output 210*a*. For example, additional amplification can be obtained by increasing the transistor size of the second reflected current transistor 606 of the second current mirror 622. Thus, the embodiments of the present invention are highly tunable from both a current and voltage point of view, advantageously, making the embodiments of the present invention ideal for various technologies. Further, the dual current mirror configuration of the embodiments of the present invention provides high speed sensing using both voltage and current amplifying stages.

Figure 7A:
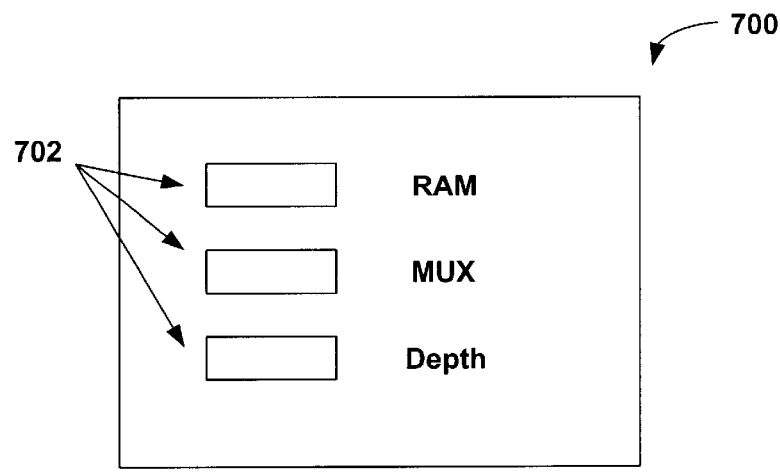
FIG. 7A is a block diagram showing an exemplary simplified memory generator graphical user interface (GUI) front end view.

In one embodiment, optimum placement and utilization of the techniques of the present invention is implemented utilizing a memory generator. FIG. 7A is a block diagram showing an exemplary simplified memory generator graphical user interface (GUI) front end 700, in accordance with an embodiment of the present invention. The exemplary memory generator GUI 700 illustrates one view utilized for entering parameters into fields 702 to define a particular memory application. Broadly speaking, the memory generator checks the validity of the entered data and executes appropriate generators to define the memory application. After receiving data utilizing the GUI front end view 700, a memory generator of the embodiments of the present invention processes the data utilizing a memory generator backend, as described next with reference to FIG. 7B.

Figure 7B:
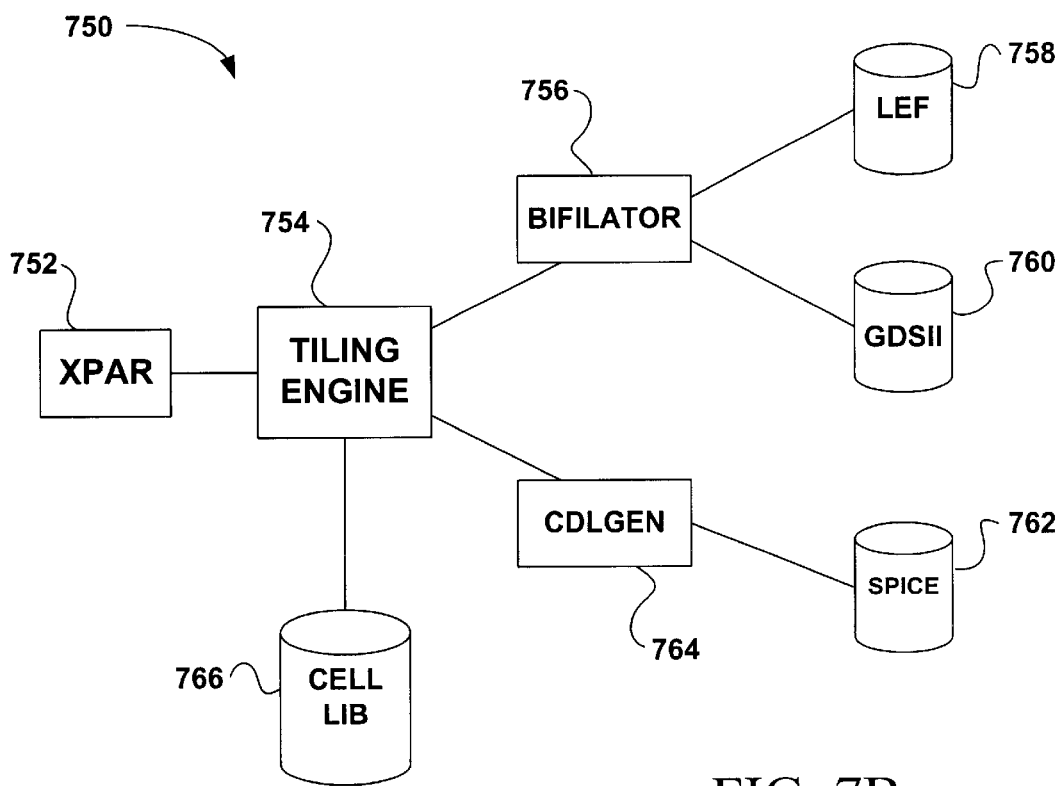
FIG. 7B is a block diagram showing an exemplary memory generator backend.

FIG. 7B is a block diagram showing an exemplary memory generator backend 750, in accordance with an embodiment of the present invention. The memory generator backend 750 comprises an XPAR process 752, a tiling engine 754, a Bifilator process 756, a CDLGEN process 764, and a cell library 766. Generally speaking, these processes function together to generate a LEF model 758, a GDSII model 760, and a SPICE model 762 for the particular memory application. The LEF model 758 comprises place and route information, which is utilized by routers to manufacture integrated circuits. The GDSII model 760 comprises mask layouts and is utilized by semiconductor foundries. The SPICE model 762 includes circuit interconnection definitions, operational properties, and schematic diagrams of the memory application. Thus, the designer can use the SPICE model of the application for cross verification.

As mentioned above, the exemplary memory generator backend 750 processes the data received via the GUI front end 700. More specifically, the XPAR process 752 encapsulates the rules needed to utilize particular cell layouts stored in the cell library. These rules, along with the parameter data for the memory application are then provided to the tiling engine 754 for optimization and cell placement. By separating the functions of the XPAR process 752 from those of the tiling engine 754, individual rules can be altered for specific applications without altering the functions and placement algorithms utilized in the timing engine 754.

The Bifilator process 756 generates an interface around a particular memory device or memory array. Generally, on a RAM there may exist over one thousand routing points for interfacing with the RAM. As a result, the entire routing configuration may change when a user changes the placement of the RAM, requiring intense reconfiguration. To address this issue, the Bifilator process 756 builds an interface around the RAM, which the user can use to interface with the RAM without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A sense amplifier for amplifying bitline current, comprising:

a first current mirror including a first load transistor and a first reflected current transistor; and a second current mirror including a second load transistor and a second reflected current transistor, the first load transistor capable of communicating a load current to the second load transistor, a reflected current flowing through the first reflected current transistor and the second reflected current transistor generates an amplified load current.

2. A sense amplifier as recited in claim 1, wherein the first load transistor and the first reflected current transistor are p-type transistors.

3. A sense amplifier as recited in claim 2, wherein the first load transistor includes a source terminal configured to receive the load current.

4. A sense amplifier as recited in claim 1, wherein the second load transistor and the second reflected current transistor are n-type transistors.

5. A sense amplifier as recited in claim 4, wherein the second load transistor includes a source terminal configured to receive the load current from the first load transistor.

6. A sense amplifier as recited in claim 1, wherein a drop in the load current across the first load transistor is configured to increase current flow in the first reflected current transistor.

7. A sense amplifier as recited in claim 6, wherein the drop in the load current across the first load transistor is configured to reduce current flow in the second load transistor, whereby current flow in the second reflected current transistor is reduced.

8. A Read only memory (ROM) having a sense amplifier for amplifying bitline current, comprising:
   a memory cell array having a depth that is defined by a plurality of wordlines and a width that is defined by a plurality of bitlines;
   a first current mirror including a first load transistor and a first reflected current transistor, the first load transistor being in electrical communication with a bitline; and
   a second current mirror including a second load transistor and a second reflected current transistor, the first load transistor capable of communicating a load current to the second load transistor, a reflected current flowing through the first reflected current transistor and the second reflected current transistor generates an amplified load current.

9. A ROM as recited in claim 8, wherein the first load transistor and the first reflected current transistor are p-type transistors.

10. A ROM as recited in claim 9, wherein the first load transistor includes a source terminal configured to receive the load current.

11. A ROM as recited in claim 8, wherein the second load transistor and the second reflected current transistor are n-type transistors.

12. A ROM as recited in claim 11, wherein the second load transistor includes a source terminal configured to receive the load current from the first load transistor.

13. A ROM as recited in claim 8, wherein a drop in the load current across the first load transistor is configured to increase current flow in the first reflected current transistor.

14. A ROM as recited in claim 13, wherein the drop in the load current across the first load transistor is configured to reduce current flow in the second load transistor, whereby current flow in the second reflected current transistor is reduced.

15. A ROM as recited in claim 8, wherein the ROM is designed using a memory generator.

16. A sense amplifier for amplifying bitline current, comprising:
   an isolation transistor in electrical communication with a bitline;
   a first current mirror including a first load transistor and a first reflected current transistor, the first load transistor and the first reflected current transistor being p-type transistors, the first load transistor capable of receiving a load current from the isolation transistor; and
   a second current mirror including a second load transistor and a second reflected current transistor, the second load transistor and the second reflected current transistor being n-type transistors, the first load transistor capable of communicating the load current to the second load transistor, a reflected current flowing through the first reflected current transistor and the second reflected current transistor to generate an amplified load current.

17. A sense amplifier as recited in claim 16, wherein a gate and drain terminal of the first load transistor are coupled together.

18. A sense amplifier as recited in claim 17, wherein the first load transistor includes a source terminal configured to receive the load current from the isolation transistor.

19. A sense amplifier as recited in claim 16, wherein a gate and drain terminal of the second load transistor are coupled together.

20. A sense amplifier as recited in claim 19, wherein the second load transistor includes a source terminal configured to receive the load current from the first load transistor.

21. A sense amplifier as recited in claim 16, wherein reflected current flow through the first reflected current transistor is increased and the reflected current flow through the second reflected current transistor is reduced when a "0" core cell on the bitline is addressed.

22. A sense amplifier as recited in claim 16, wherein the sense amplifier is designed using a memory generator.

* * * * *